US012417650B2

(12) United States Patent
Deng et al.

(10) Patent No.: US 12,417,650 B2
(45) Date of Patent: Sep. 16, 2025

(54) MULTI-MICROLENS FINGERPRINT SENSOR WITH PHOTODIODES IN GROUPS; EACH PHOTODIODE OF THE PHOTODIODE GROUPS HAVING A FIELD OF VIEW THROUGH A MICROLENS, PINHOLES OF AN UPPER BLACK MASK LAYER, AND PINHOLES OF A METAL LAYER HAVING PINHOLE RINGS WITH PINHOLES OF AN OUTER RING LARGER THAN THOSE OF AN INNER RING

(71) Applicant: OmniVision Technologies, Inc., Santa Clara, CA (US)

(72) Inventors: Jau-Jan Deng, Taipei (TW); Yi-Wei Liu, New Taipei (TW)

(73) Assignee: OmniVision Technologies, Inc., Santa Clara, CA (US)

( * ) Notice: Subject to any disclaimer, the term of this patent is extended or adjusted under 35 U.S.C. 154(b) by 442 days.

(21) Appl. No.: 17/824,786

(22) Filed: May 25, 2022

(65) Prior Publication Data
US 2023/0386247 A1    Nov. 30, 2023

(51) Int. Cl.
*G06V 40/13* (2022.01)
*H10F 39/00* (2025.01)
*H10F 39/18* (2025.01)
*H10K 59/40* (2023.01)
*H10K 59/60* (2023.01)

(52) U.S. Cl.
CPC ......... *G06V 40/1318* (2022.01); *H10F 39/18* (2025.01); *H10F 39/8063* (2025.01); *H10K 59/40* (2023.02); *H10K 59/60* (2023.02)

(58) Field of Classification Search
CPC .. G06V 40/1318; G06V 10/141; H10F 39/18; H10F 39/8063; H10K 59/40; H10K 59/60; H10K 59/65
See application file for complete search history.

(56) References Cited

U.S. PATENT DOCUMENTS

| 10,410,037 | B2 * | 9/2019 | He .................... G06F 3/0412 |
| 11,002,888 | B2 * | 5/2021 | Ma .................... H10K 77/10 |
| 11,003,266 | B2 * | 5/2021 | Kim .................. H10F 39/8053 |
| 11,017,200 | B1 * | 5/2021 | Wickboldt .......... H04L 63/0861 |
| 11,328,150 | B2 | 5/2022 | Fan |
| 11,600,099 | B2 * | 3/2023 | Wang ................ G06V 40/1318 |

(Continued)

*Primary Examiner* — Caleb E Henry
(74) *Attorney, Agent, or Firm* — COZEN O'CONNOR

(57) ABSTRACT

An image sensor for imaging fingerprints has multiple photodiode groups each having a field of view determined by pinholes of upper and lower mask layers and a metal layer, each field of view being through a microlens. Many photodiode groups have fields of view outwardly splayed from a group having a center-direct field of view. A diameter of pinholes of the metal layer distant from the group having a center-direct field of view have larger diameter than a pinhole of the photodiode group having a center-direct field of view. A method of matching illumination of a group of photodiodes with center-direct field of view to illumination of photodiode groups having outwardly splayed fields of view includes sizing a pinhole in the metal layer of photodiode groups with outwardly splayed fields of view larger than a pinhole associated with of photodiode groups having a center-direct field of view.

13 Claims, 4 Drawing Sheets

(56) References Cited

U.S. PATENT DOCUMENTS

| | | | | |
|---|---|---|---|---|
| 2014/0145177 A1* | 5/2014 | Lee | ................... | H10D 86/441 |
| | | | | 438/34 |
| 2014/0346498 A1* | 11/2014 | Ahn | ................ | H10D 30/6723 |
| | | | | 257/43 |
| 2015/0021627 A1* | 1/2015 | Fujita | .................. | H10F 71/00 |
| | | | | 257/82 |
| 2015/0331508 A1* | 11/2015 | Nho | ................... | G06F 3/0445 |
| | | | | 345/173 |
| 2016/0302665 A1* | 10/2016 | Swedish | ............ | A61B 3/0091 |
| 2017/0111558 A1 | 4/2017 | Brueckner et al. | | |
| 2017/0213872 A1* | 7/2017 | Jinbo | ............... | H10K 59/8722 |
| 2017/0220840 A1* | 8/2017 | Wickboldt | ......... | G06V 40/1335 |
| 2018/0012069 A1* | 1/2018 | Chung | .............. | G06V 40/1394 |
| 2018/0239941 A1* | 8/2018 | Mackey | ............ | G06V 40/1318 |
| 2019/0179488 A1 | 6/2019 | Klenkler et al. | | |
| 2019/0214420 A1* | 7/2019 | Kim | .................. | H10F 39/18 |
| 2020/0026898 A1* | 1/2020 | Fan | ................... | G06V 40/1318 |
| 2020/0117875 A1* | 4/2020 | Cai | ................... | G06V 40/1306 |
| 2020/0184185 A1* | 6/2020 | Mackey | ............ | G06V 40/1324 |
| 2020/0242320 A1* | 7/2020 | Zeng | ................ | H10F 39/198 |
| 2020/0380239 A1* | 12/2020 | Lee | .................. | H10K 59/131 |
| 2020/0387684 A1* | 12/2020 | Setlak | ................. | G06V 40/40 |
| 2022/0050992 A1* | 2/2022 | Wang | ............... | G06V 40/1318 |

\* cited by examiner

Pinhole Sizes Relative, Not To Scale of Pinhole Spacing

MULTI-MICROLENS FINGERPRINT SENSOR WITH PHOTODIODES IN GROUPS; EACH PHOTODIODE OF THE PHOTODIODE GROUPS HAVING A FIELD OF VIEW THROUGH A MICROLENS, PINHOLES OF AN UPPER BLACK MASK LAYER, AND PINHOLES OF A METAL LAYER HAVING PINHOLE RINGS WITH PINHOLES OF AN OUTER RING LARGER THAN THOSE OF AN INNER RING

BACKGROUND

Many modern cellphone operating systems, including Apple iOS and Android, are configurable to use biometrics, such as fingerprints, as an alternative to user entry of unlock codes to validate user identity. A prior optical sensor for reading fingerprints used an electronic camera equipped with a single lens and an image sensor with a single array of photosensors to image a fingerprint surface of a finger through an OLED cell-phone display. To image a reasonable area of the finger, the lens and array of photosensors were large and required considerable space between lens and the array of photosensors—posing issues in the limited space available in cellphones.

As cell phone processing power and display size increases, cell phone power demand rises, yet customers demand long battery life. These two pressures force cell phone designers to include ever-larger batteries. Increasing battery size without increasing phone size requires the battery to extend throughout the back of the phone—encroaching on space formerly occupied by single-lens fingerprint sensor optics.

Cost of fabricating a wafer of integrated circuits, including image sensor integrated circuits, is relatively constant for a given process, while with smaller circuits, there are more circuits per wafer—thus smaller circuits typically cost less to make. Large circuits also have a higher probability of fabrication defects than smaller circuits, meaning a higher percentage of large circuits are discarded as defective than of smaller circuits. These two effects make large integrated circuits exponentially more expensive to make than smaller integrated circuits on the same process.

SUMMARY

In an embodiment, an image sensor for imaging fingerprints has multiple photodiode groups each having a field of view determined by location and characteristics of a microlens of an array of microlenses as well as and locations and sizes of pinholes of upper and lower mask layers and a metal layer, each field of view being through the microlens. Many photodiode groups have fields of view outwardly splayed from a group having a center-direct field of view to permit use of a smaller image sensor than the fingerprints. A diameter of pinholes of the metal layer distant from the group having a center-direct field of view have larger diameter than a pinhole of the photodiode group having a center-direct field of view.

In another embodiment, a method of matching illumination of a group of photodiodes with center-direct field of view to illumination of photodiode groups having outwardly splayed fields of view includes sizing a pinhole in the metal layer associated with photodiode groups with outwardly splayed fields of view larger than a pinhole associated with of photodiode groups having a center-direct field of view.

DETAILED DESCRIPTION OF THE EMBODIMENTS

In order to provide a fingerprint sensor thin enough to fit between an organic light emitting diode (OLED) screen and a battery of a cell phone, we use a sensor resembling the compound insect eye with many microlenses each focusing light on one, or a small group of, associated photodiodes. Further, in order to help minimize area of the fingerprint sensor, we splay outwards view angles of lenses located near periphery of the sensor and keep view angles of central lenses more directly upwards through the OLED screen; by doing so the area of the fingerprint sensor can be smaller than the area of fingerprint it is configured to photograph. Since fingerprint sensors include integrated circuits that are less expensive to make if small, outward splaying view angles in this way can lessen fingerprint sensor cost.

In typical fingerprints, ridges have lower reflectance than the valleys between ridges. The fingerprint sensor photographs these ridges and valleys so a processor can compare patterns in the ridges and valleys to a database of one or more master patterns.

Figure 1:
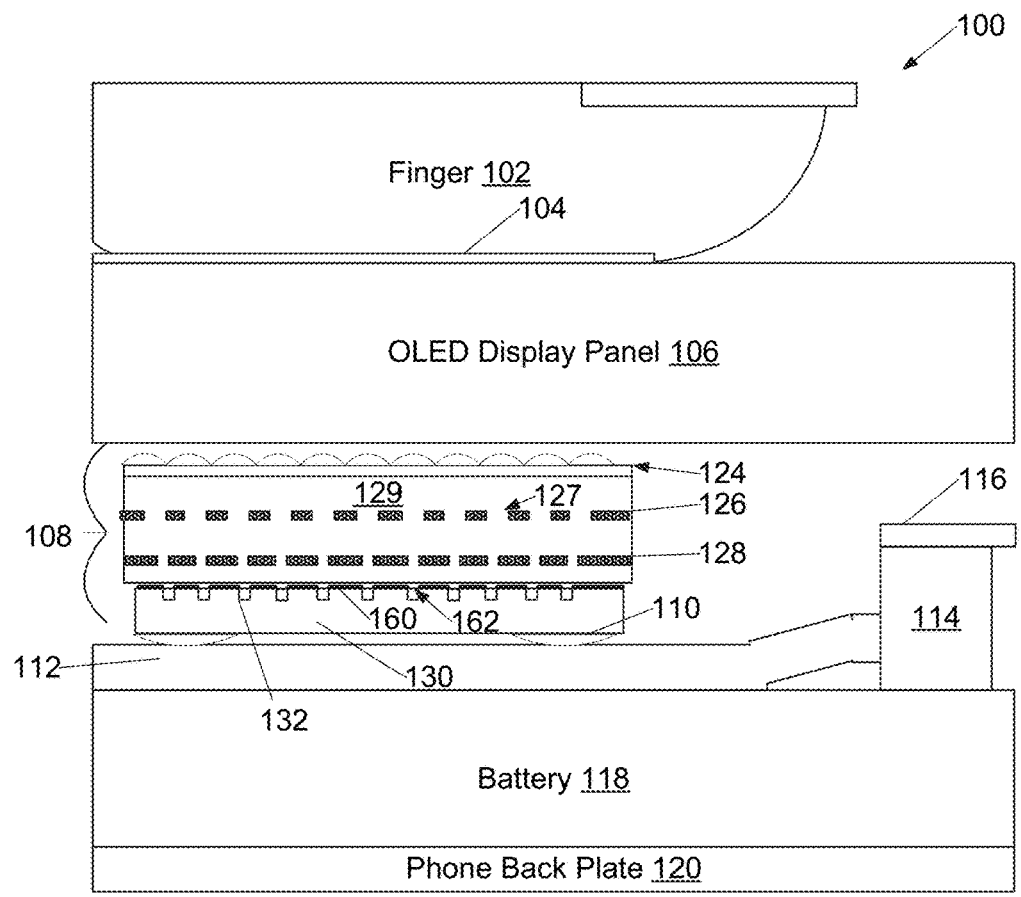
FIG. 1 is a cross sectional schematic diagram of a finger, OLED display, an optical fingerprint sensor module having a microlens array, masks bearing openings or pinholes, spacer, and image sensor, and a flexible circuit board.

In an example 100 (FIG. 1), with height of cell phone components greatly exaggerated, a finger 102 is positioned with its fingerprint area 104 over an OLED screen 106. Beneath the OLED screen 106 lies fingerprint sensor 108, which is ball-bonded 110 to a flexible circuit board 112. Circuit board 112 may couple through connectors 114 to other circuit boards 116 of the cell phone. Beneath circuit board 112 lies a battery 118 and a back plate 120 of the phone.

Figure 2A:
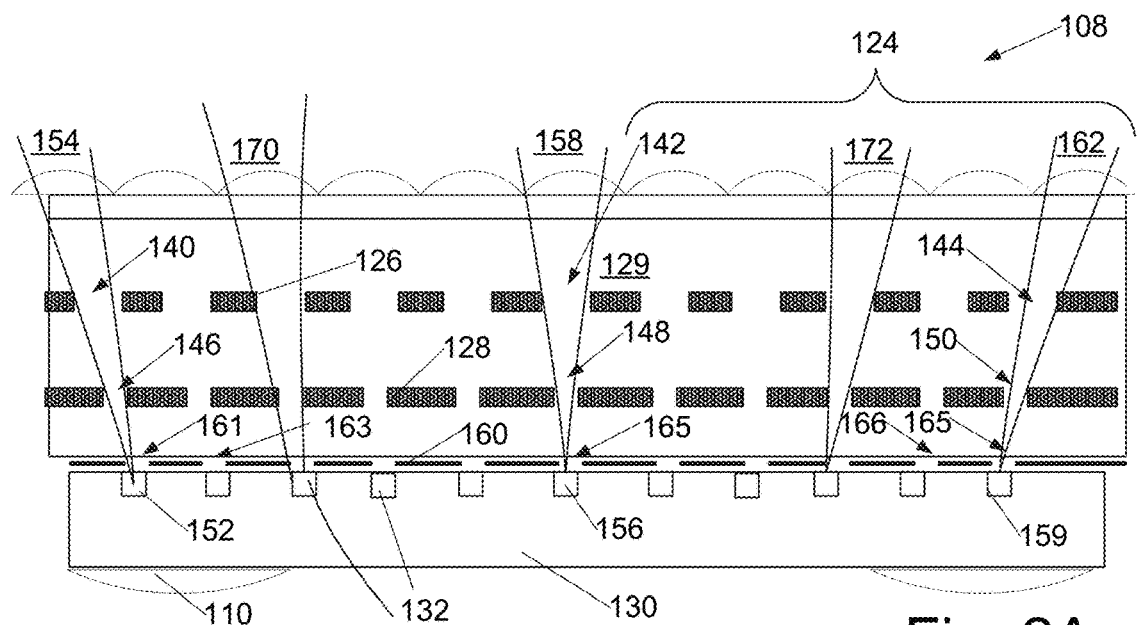
FIG. 2A is a cross sectional schematic diagram of the fingerprint sensor module of FIG. 1 illustrating multiple photosensor groups with fields of view ranging from a central direct angle to a maximum splayed outward angle.

The fingerprint sensor 108 (FIG. 1 and enlarged in FIG. 2A) has an array of microlenses 124 where each microlens is aligned with an opening, or pinhole 127, in an upper black mask 126, an opening, or pinhole, in an optional lower black mask 128, the masks with pinholes are embedded in a transparent spacer 129. The microlenses 124 and pinholes in upper black mask 126 and lower black mask 128 are aligned with pinholes 142 in a topmost metal layer 160, usually a metal-4 layer, of an image sensor integrated circuit to illuminate groups of one or more photodiodes 132 formed in semiconductor 130 of the image sensor integrated circuit. Together, the microlens and its associated, aligned, openings or pinholes 127, 162 serve as a collimator controlling a field of view of the associated group of photodiodes; the alignment of pinholes 127 in upper black mask 126 to pinholes in the topmost metal layer 160 being significant in determining the field of view. The upper black mask layer 126 is disposed above the lower black mask layer 128, and both black mask layers are disposed above the metal layer 160. The pinholes in the lower black mask 128, and light-absorbing qualities of the upper 126 and lower black mask 128 serve to absorb scattered light arriving from directions outside the field of view; without the lower black mask layer some light from directions outside the field of view may be reflected by the topmost metal layer and scatter into other pinholes and photodiode groups. The lower black mask layer thereby improves image contrast and quality.

While the topmost metal layer may be a metal layer, such as a metal-4 layer, of the front side of the image sensor integrated circuit for frontside illuminated image sensors, if the image sensor integrated circuit is a backside illuminated image sensor the topmost metal layer may be a metal layer deposited on the image sensor integrated circuit that also serves to protect non-photodiode regions of the image sensor integrated circuit from incoming light.

Each microlens 212 of the array 210 (FIG. 2B) of microlenses 124 has optical characteristics including a focal length. In a particular embodiment, for simplicity all microlenses of the microlens array have the same focal length, the focal length optimized for a six-degree angle of splay from a direct field of view. In an alternative embodiment, focal length of microlenses is varied across the array of microlenses, with lenses closest to the array center where photodiode groups have a direct field of view of the fingerprint region having shorter focal length than those with wide angles of splay, such as a 10-degree angle, from a direct field of view.

Figure 2B:
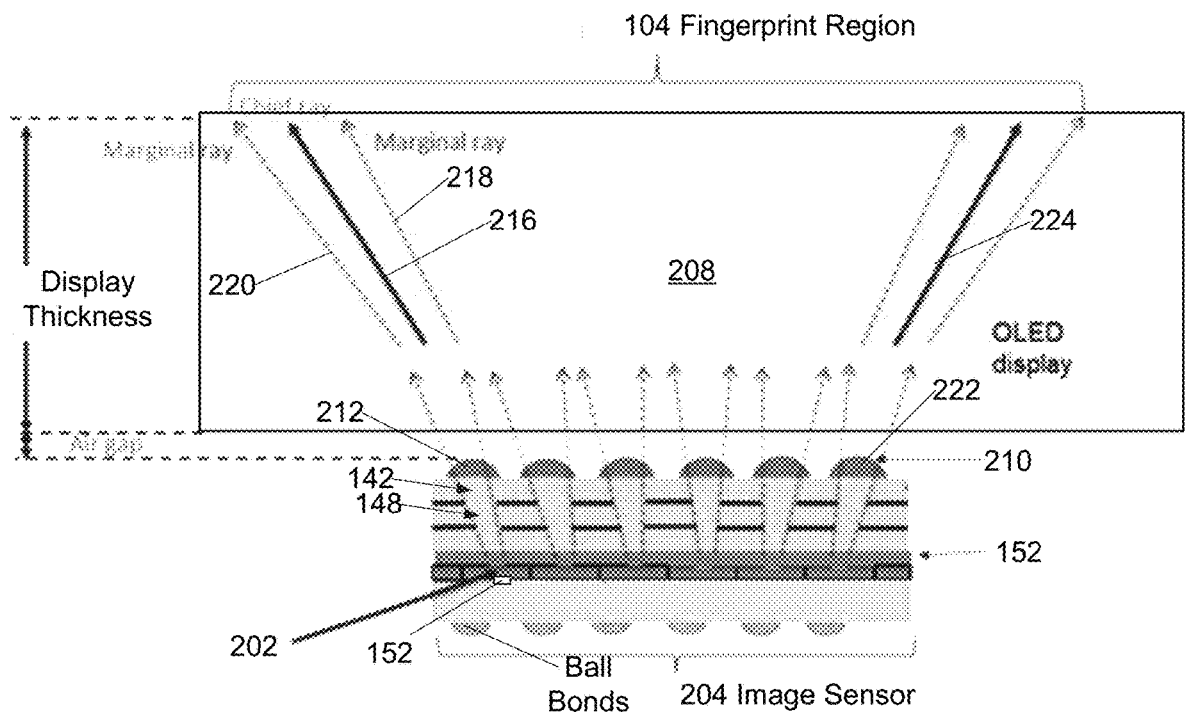
FIG. 2B is a cross sectional schematic diagram of the fingerprint sensor module when applied to a backside of an OLED screen illustrating alignment of the pinholes and microlenses.

In embodiments, the openings or pinholes 142 in upper black mask 126 and the openings or pinholes 148 in lower black mask 128 are aligned with openings 202 (FIG. 2B) in a metal layer above photodiode groups 152 of the image sensor 204. In some embodiments, an infrared filter 206 may be provided above image sensor 204. Each microlens 212 is configured to focus light from an associated field of view of fingerprint area 104 through an OLED display 208 of a cellphone through associated pinholes onto an associated photodiode group 152. An exemplary chief ray 216, 224 and marginal rays 218, 220 are illustrated in FIG. 2B for the field of view of microlens 212 and microlens 222 illustrating how the outwardly splayed fields of view provide ability to image a wider zone of fingerprint area 104 than width of image sensor 204.

The openings, 140, 142, 144, in upper black mask 126 and openings, 146, 148, 150, in lower black mask 128 are aligned such that a first group of photodiodes 152 has a left field of view 154, a second group of photodiodes 156 has a central direct field of view 158, and a third group of photodiodes 159 has a rightfield of view 162. For purposes of this document, angled fields of view such as left field of view 154 and right field of view 162 that are not aimed directly at a nearest point of fingerprint area 104 are outward-angled fields of view. In embodiments, as illustrated, groups of photodiodes have a plurality of fields of view at angles ranging from a left angled view 154 through an intermediate left 170 and a center direct view 158 and intermediate right 172 to a right-angled field of view 162. Each field of view is determined by locations of the pinholes of both the upper and lower mask layers and is through a microlens.

In actual embodiments, there are thousands of pinholes and groups of photodiodes in the array to provide adequate resolution to recognize fingerprints of particular individuals. Further, fields of view of photodiode groups taper across the image sensor from strongly outward-angled fields of view through mildly outward-angled and center-direct fields of view, then through mildly outward-angled to strongly outward-angled fields of view. For example, an image sensor may be configured with a square array of 128×128 photodiode groups, with each mask layer having arrays of 128× 128 openings or pinholes. The figures illustrate far fewer photodiode groups and pinholes for simplicity.

Providing a proportion of pinholes and photodiodes with outward-angled fields of view along with pinholes and photodiodes with central direct fields of view is advantageous because it permits imaging more of the fingerprint area 104 than a surface area of the fingerprint sensor 108 itself, thus allowing for use of smaller and therefore less expensive fingerprint sensor integrated circuits.

Figure 3:
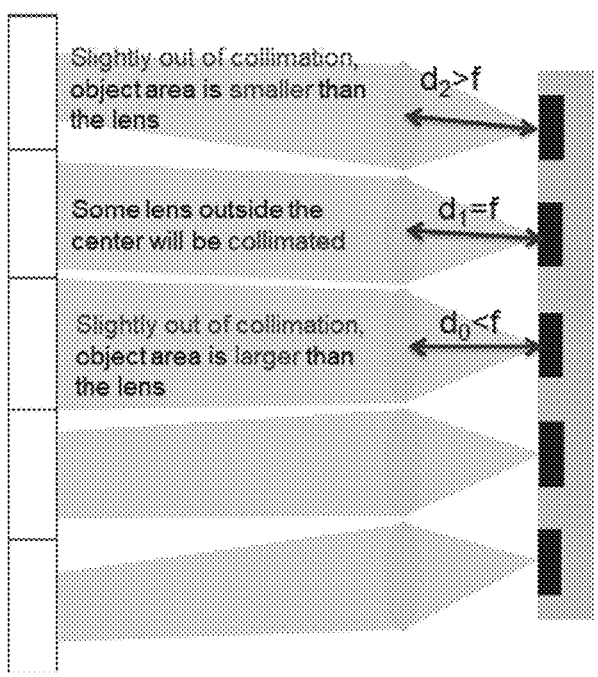
FIG. 3 is a schematic diagram illustrating why photodiodes with same-diameter, outward-angled, pinholes typically receive less light than photodiodes with central direct fields of view.

We have found that, as illustrated in FIG. 3, assuming constant illumination of the fingerprint area 104 by OLED screen 106 and constant size pinholes, pinholes with outward-angled fields of view such as pinholes 140, 144, 146, 150 admit less light to associated photodiodes, such as groups of photodiodes 159, 152, than do pinholes, such as pinholes 142, 148, providing a central direct field of view. This admission of less light to photodiodes having outward-angled fields of view than photodiodes with central direct of view is referenced herein as anisotropic light admission and can cause issues with image processing of imaged fingerprints.

Figure 4:
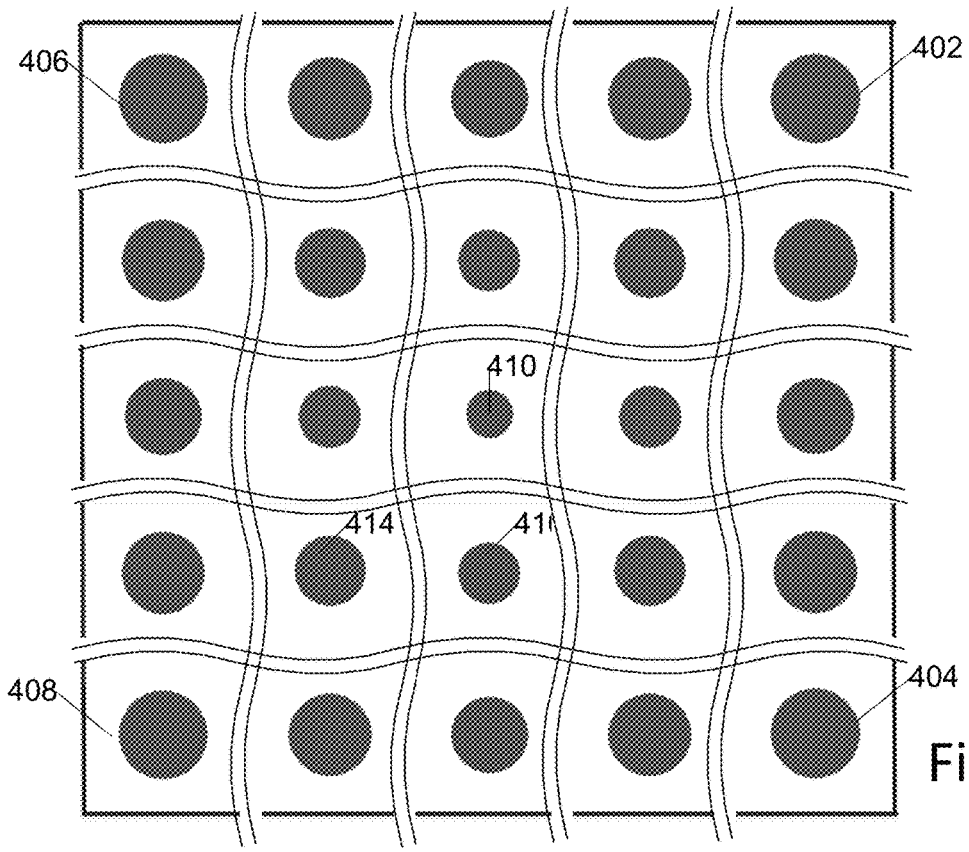
FIG. 4 is a diagram illustrating pinholes of a metal layer having larger diameters for outward-angled field of view pinholes than for central-direct field of view pinholes to compensate for otherwise nonuniform photodiode illumination.

In order to compensate for anisotropic light admission, we form outward-angled pinholes in the metal layer 160, such as pinholes 161, 163, 165, 166, with greater diameter as illustrated by pinholes 402, 404, 406, 408 in FIG. 4 than central direct field of view pinholes, such as pinholes 167 and illustrated by pinholes 410, with intermediate size pinholes 414, 416 associated with photodiode groups having mild outwardly angled fields of view.

In a particular embodiment having maximum ten degree outwardly angled fields of view offset from zero-degree central-direct fields of view, a microlens has radius of curve (Roca)=16-18 micrometers (um), a focal length FL=30.7 um and a lens pitch of 21.5 um with total thickness of transparent spacer 129 and masks between 40 and 45 um, pinhole diameter in the metal layer 160 tapers from three um for pinholes 167, 410 having central-direct fields of view near the image sensor center to six um for pinholes 161, 165. 408 having maximally outwardly angled fields of view near the image sensor periphery. A ratio of diameters of pinholes associated with photodiode groups having maximally outwardly angled fields of view to diameters of pinholes associated with central-direct fields of view thus may be 1.5:1 in an embodiment, and in some embodiments is 2:1.

In infrared-sensing embodiments, there may be an infrared filter (not shown), which is omitted in other embodiments that image fingerprints with visible light. In embodiments, this infrared filter is disposed adjacent the metal layer 160.

In a typical application, the organic light-emitting diode (OLED) display panel or OLED screen 106 of the cell phone, is of a known thickness and at least semitransparent to light so images can be captured by the image sensor of the fingerprint area 104 of finger 102.

In embodiments, a central axis of the most outwardly angled field of view is at, or at least at, a 15-degree angle to a central axis of a central-direct field of view. In alternative embodiments the central axis of the most outwardly angled field of view is at a 12.5-, 10-, or 7.5-degree angle to the central axis of a central-direct field of view. The field of view of each photodiode group is determined by locations and diameters of an opening, or pinhole, of the upper black mask 126, an opening, or pinhole, of the metal layer 160, and the photodiode group.

Figure 5:
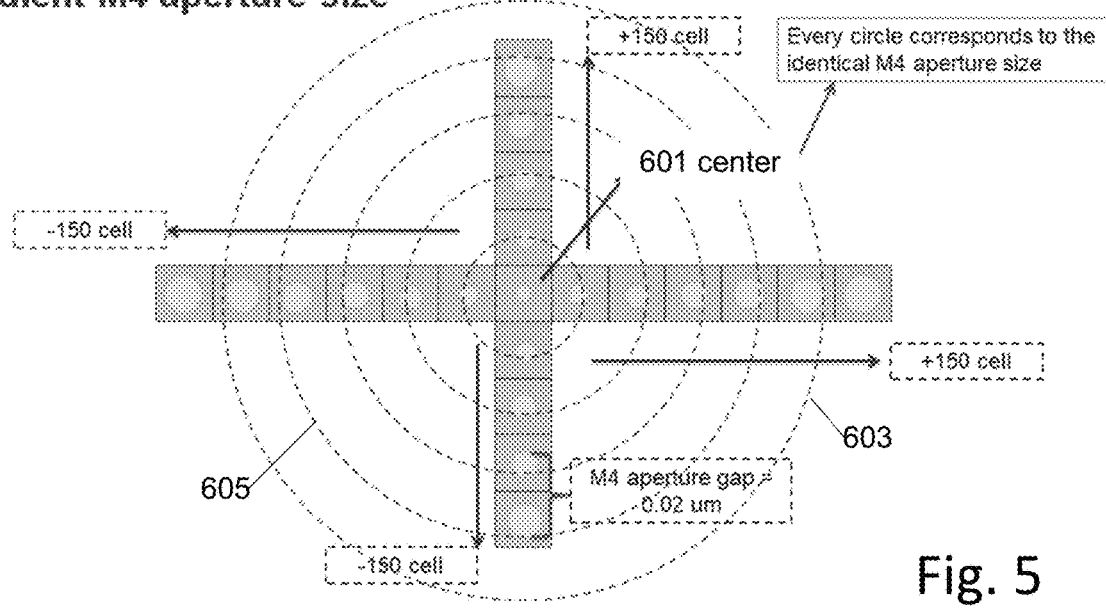
FIG. 5 is a diagram illustrating rings of equal-diameter openings or pinholes of the mask layer of the image sensor integrated circuit.

In embodiments, as shown in FIG. 5, a diameter of pinholes of the upper layer is a function of distance of those pinholes from a center 601 of the image sensor array, with pinholes of same diameters forming rings 603, 605, with larger-diameter pinholes at greater distances from the array center than smaller-diameter pinholes. Each pinhole other than photodiode groups having a central-direct field of view is associated with a group of one or more photodiodes having a field of view through the pinholes of the upper layer and having an outward-splayed field of view at an angle relative to a center direct field of view that increases with distance from a photodiode group having a central-direct field of view. In some embodiments, there are a plurality of rings of equal-diameter pinholes on the metal layer.

Figure 6:
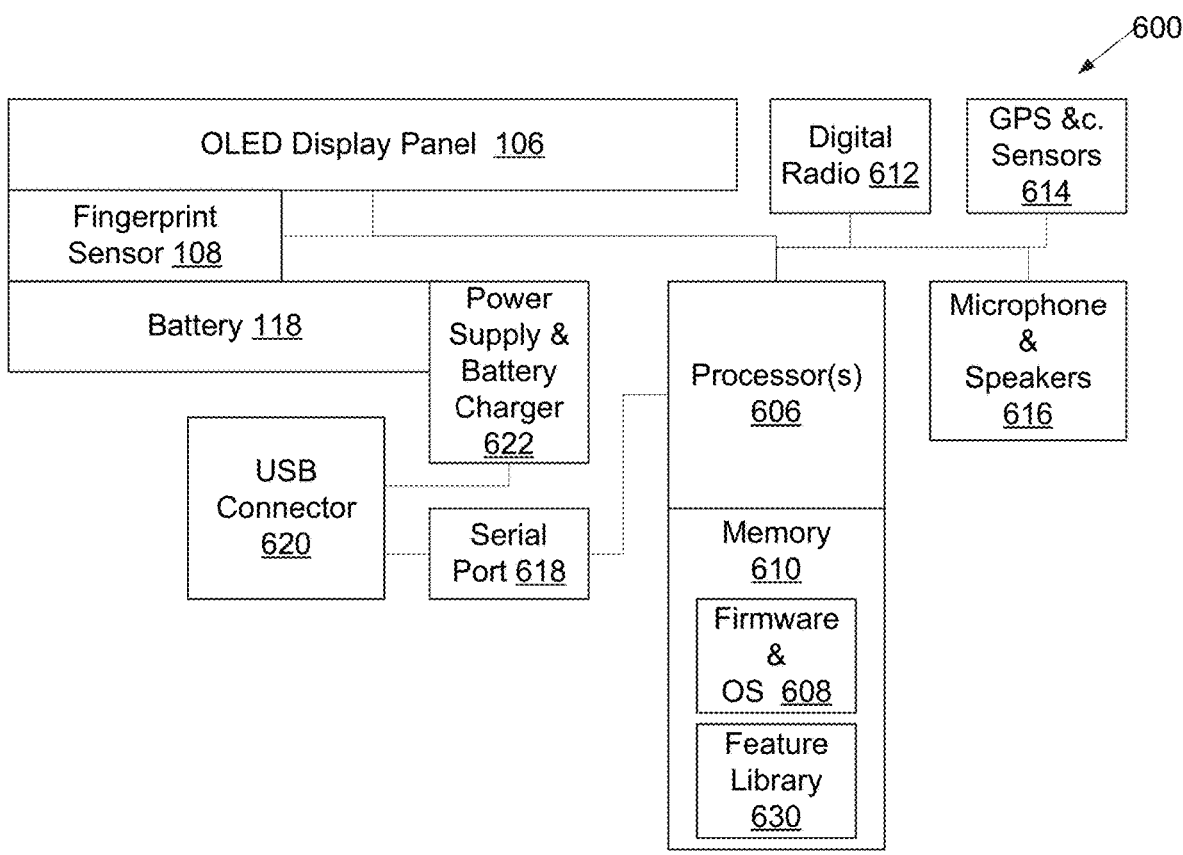
FIG. 6 is a block diagram illustrating a cellular telephone device in which the optical fingerprint sensor may be used.

The fingerprint sensor 108 is used in a cellular telephone 600 (FIG. 6); the smart cellular telephone 600, or other electronic device such as a tablet computer, fast-access gun safe, entry control system, or tablet computer incorporates OLED screen 106, typically having touch sensing capability, operable under control by one or more processors 606 coupled to receive raw images or extracted features from fingerprint sensor 108. One or more processors 606 operate under control of firmware and an operating system 608 in a memory system 610 and are also coupled to one or more digital radios 612 configured for two-way communications with at least digital cellular towers. The processors 606 are also coupled to a global positioning system receiver and other sensors 614 such as accelerometers, a microphone and speaker 616, and in many embodiments a serial port 618 coupled to a universal serial bus (USB) interface 620. Cellular telephone 600 is powered by the battery 118, through a power supply circuit and recharged by a charger 622.

Figure 7:
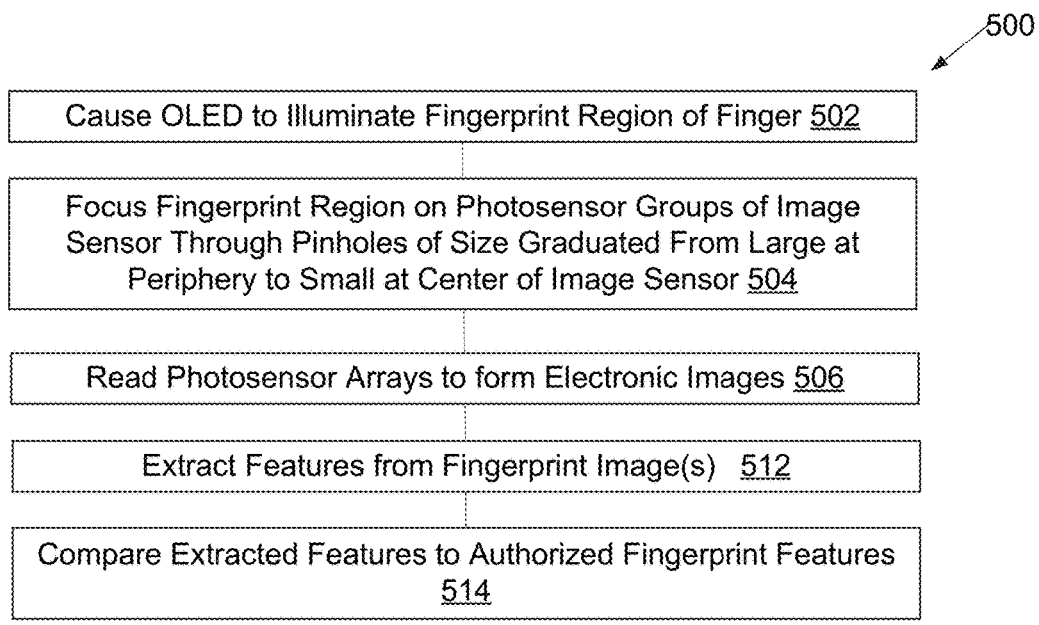
FIG. 7 is a flowchart illustrating a method for how the optical fingerprint sensor is used in a system.

The fingerprint sensor is operated by a method 500 (FIG. 7) operable on processor 606 under control of the firmware and operating system 608 that includes illuminating 502 the fingerprint area 104 of the finger 102 using the OLED screen 106; light from the fingerprint area 104 is focused 504 by microlenses 124 onto an associated photodiode group 132. The photodiode groups 132 are then read 506 to form electronic fingerprint images. Features are then extracted 512 from the electronic fingerprint images or from the overlapping electronic fingerprint images; these features are then compared 514 to features associated with one or more users in a feature library 630 of features comprising features associated with one or more fingers of one or more authorized users in memory system 610. A successful comparison verifies identity of a user to whom finger 102 belongs, and an unsuccessful comparison may deny access. In alternative embodiments such as a gun safe or building access control lock, illumination may be provided by devices other than an OLED.

The concepts and features herein described can be combined in a variety of ways, some of which anticipated by the inventors include:

An image sensor designated A and adapted for imaging fingerprints includes multiple groups of photodiodes, each group of photodiodes having a field of view determined by locations of a pinhole of an upper mask layer, a pinhole of a metal layer, and the photodiode group, and each field of view is through a microlens. Multiples of the groups of photodiodes have fields of view outwardly splayed from a group of photodiodes having a center-direct field of view; a diameter of pinholes of the metal layer distant from the group of photodiodes having a center-direct field of view having larger diameter than a pinhole of the metal layer associated with the group of photodiodes having a center-direct field of view.

An image sensor designated AA including the image sensor designated A wherein there are at least a first ring of equal-diameter pinholes in the metal layer with a first diameter and a ring of equal-diameter pinholes with a second diameter.

An image sensor designated AB including the image sensor designated A or AA wherein the outwardly splayed angles of view include fields of view outwardly splayed at at least 7.5 degrees.

An image sensor designated AC including the image sensor designated AB wherein the outwardly splayed angles of view include field of view outwardly splayed at at least 10 degrees.

An image sensor designated AD including the image sensor designated AB wherein the outwardly splayed angles of view include fields of view outwardly splayed at at least 12.5 degrees.

An image sensor designated AE including the image sensor designated AB wherein the outwardly splayed angles of view include fields of view outwardly splayed at at least 15 degrees.

An image sensor designated AF including the image sensor designated A, AB, AC, AD, or AE, wherein a ratio of diameters of at least one pinhole on the metal layer associated with photodiode groups having outwardly angled fields of view to diameters of pinholes on the metal layer associated with central-direct fields of 2:1.

An image sensor designated AG including the image sensor designated A, AB, AC, AD, AE, or AF, where each group of photodiodes includes a single photodiode.

An image sensor designated Ah including the image sensor designated A, AB, AC, AD, AE, or AF, where each group of photodiodes includes a plurality of photodiodes.

A method of matching illumination of a group of photodiodes having a center-direct field of view to illumination of a first group of photodiodes having an outwardly-splayed field of view designated B, where each field of view is determined by a pinhole in an upper mask layer and a pinhole in a metal layer, the method including sizing a pinhole in the metal layer associated with the first group of photodiodes having an outwardly-splayed field of view larger than a pinhole in the upper mask layer associated with the group of photodiodes having a center-direct field of view.

A method designated BA including the method designated B further including sizing a pinhole in the metal layer associated with a second group of photodiodes having an outwardly splayed field of view larger than the pinhole in the metal layer associated with the second group of photodiodes having an outwardly splayed field of view.

A method designated BB including the method designated B or BA where the second group of photodiodes having an outwardly splayed field of view is at a greater distance from the group of photodiodes having a center-direct field of view than a distance from the first group of photodiodes having an outwardly splayed field of view to the group of photodiodes having a center-direct field of view.

A method designated BC including the method designated BB, BA, or B where each group of photodiodes includes a single photodiode.

A method designated BD including the method designated BB, BA, or B where each group of photodiodes includes a plurality of photodiodes.

A system designated C incorporating a fingerprint sensor has: a plurality of groups of photodiodes, each group of photodiodes having a field of view determined by characteristics of a microlens of an array of microlenses, size and location of an opening in an upper black layer, location of a pinhole in a metal layer, and location of the photodiode group, each field of view being through the microlens. A plurality of the groups of photodiodes have fields of view outwardly splayed from a group of photodiodes having a center-direct field of view; and a diameter of pinholes of the metal layer distant from the group of photodiodes having a center-direct field of view having larger diameter than a pinhole of the metal layer associated with the group of photodiodes having a center-direct field of view.

A system designated CA including the system designated C further including: a processor coupled to read the photodiodes of the fingerprint sensor; a memory coupled to the processor, the memory having recorded within it a feature library; the processor configured by firmware in the memory to illuminate a fingerprint area of a finger, read fingerprint images from the fingerprint sensor, extract features from the fingerprint images, and compare the extracted features to features in the feature library to identify a user.

A system designated CB including the system designated C embedded in a device selected from a cellular telephone or a safe or access control lock.

Changes may be made in the above methods and systems without departing from the scope hereof. It should thus be noted that the matter contained in the above description or shown in the accompanying drawings should be interpreted as illustrative and not in a limiting sense. The following claims are intended to cover all generic and specific features described herein, as well as all statements of the scope of the present method and system, which, as a matter of language, might be said to fall therebetween.

What is claimed is:

1. An image sensor adapted for imaging fingerprints, comprising:
   a plurality of groups of photodiodes, each group of photodiodes having a field of view determined by characteristics of a microlens of an array of microlenses, location and size of an associated pinhole of an upper black mask layer, location of a pinhole of a metal layer, and a location of the photodiode group, each field of view being through the microlens;
   a plurality of the groups of photodiodes having fields of view outwardly splayed from a group of photodiodes having a center-direct field of view;
   a diameter of pinholes of the metal layer distant from the group of photodiodes having a center-direct field of view having larger diameter than a pinhole of the metal layer associated with the group of photodiodes having a center-direct field of view;
   there being at least a first ring of equal-diameter pinholes on the metal layer with a first diameter and a second ring of equal-diameter pinholes with a second diameter on the metal layer, the first diameter being greater than the second diameter, the first ring of equal diameter pinholes surrounding the second ring of equal diameter pinholes.

2. The image sensor of claim 1, the outwardly splayed angles of view including fields of view outwardly splayed by at least 7.5 degrees.

3. The image sensor of claim 2, the outwardly splayed angles of view including fields of view outwardly splayed by at least 10 degrees.

4. The image sensor of claim 3, the outwardly splayed angles of view including fields of view outwardly splayed by at least 12.5 degrees.

5. The image sensor of claim 4, the outwardly splayed angles of view including fields of view outwardly splayed at at least 15 degrees.

6. The image sensor of claim 1, wherein a ratio of diameters of at least one pinhole associated with photodiode groups having outwardly angled fields of view to diameters of pinholes associated with central-direct fields is 2:1.

7. The image sensor of claim 1, each group of photodiodes including a single photodiode.

8. The image sensor of claim 1, each group of photodiodes including a plurality of photodiodes.

9. A system incorporating a fingerprint sensor, the fingerprint sensor comprising:
   a plurality of groups of photodiodes, each group of photodiodes having a field of view determined by characteristics of a microlens of an array of microlenses, size and location of an opening in an upper black layer, location of a pinhole in a metal layer, and location of the photodiode group, each field of view being through the microlens;
   a plurality of the groups of photodiodes having fields of view outwardly splayed from a group of photodiodes having a center-direct field of view; and
   a diameter of pinholes of the metal layer distant from the group of photodiodes having a center-direct field of view having larger diameter than a pinhole of the metal layer associated with the group of photodiodes having a center-direct field of view;
   a processor coupled to read the photodiodes of the fingerprint sensor;
   a memory coupled to the processor, the memory having recorded within it a feature library;
   the processor being configured by firmware in the memory to illuminate a fingerprint area of a finger, read fingerprint images from the fingerprint sensor, extract features from the fingerprint images, and compare the extracted features to features in the feature library to identify a user.

10. The system of claim 9 embedded in a cellular telephone.

11. The system of claim 9 embedded in a safe or access control lock.

12. The system of claim 9, a focal length of all microlenses of the array of microlenses being the same.

13. The system of claim 9, a focal length of a center microlens of the array of microlenses being less than that of a second microlens of the array of microlenses.

* * * * *